United States Patent
Kaminski et al.

(10) Patent No.: US 6,349,385 B1
(45) Date of Patent: *Feb. 19, 2002

(54) DUAL POWER SUPPLY FAN CONTROL—THERMISTOR INPUT OR SOFTWARE COMMAND FROM THE PROCESSOR

(75) Inventors: George A. Kaminski, Houston; George F. Squibb, Spring, both of TX (US)

(73) Assignee: Compaq Computer Corporation, Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,037

(22) Filed: Nov. 20, 1998

(51) Int. Cl.$^7$ ................................................ H05K 7/20
(52) U.S. Cl. ........................ 713/300; 361/688; 361/719; 702/132
(58) Field of Search ................................ 713/300–340; 361/687–723; 702/130–136

(56) References Cited

U.S. PATENT DOCUMENTS

| | | | | |
|---|---|---|---|---|
| 4,756,473 A | * | 7/1988 | Takemae et al. | 236/49.3 |
| 4,817,865 A | * | 4/1989 | Wray | 236/49.3 |
| 5,121,291 A | | 6/1992 | Cope et al. | 361/695 |
| 5,249,741 A | * | 10/1993 | Bistline et al. | 236/49.3 |
| 5,287,244 A | * | 2/1994 | Hileman et al. | 361/687 |
| 5,436,827 A | | 7/1995 | Gunn et al. | 700/82 |
| 5,469,320 A | * | 11/1995 | Walker et al. | 361/33 |
| 5,484,012 A | * | 1/1996 | Hiratsuka | 165/247 |
| 5,513,361 A | | 4/1996 | Young | 713/320 |
| 5,574,667 A | * | 11/1996 | Dinh et al. | 364/528.35 |
| 5,631,800 A | | 5/1997 | Jin et al. | 361/103 |
| 5,687,079 A | * | 11/1997 | Bauer et al. | 364/175 |
| 5,726,874 A | | 3/1998 | Liang | 363/141 |
| 5,727,928 A | | 3/1998 | Brown | 417/44.11 |
| 5,777,897 A | * | 7/1998 | Giorgio | 364/528.34 |
| 5,790,430 A | * | 8/1998 | Steiert | 361/6 |
| 5,825,642 A | * | 10/1998 | Ishii et al. | 363/141 |
| 5,848,282 A | * | 12/1998 | Kang | 713/323 |
| 5,920,264 A | * | 7/1999 | Kim et al. | 340/584 |
| 5,926,367 A | * | 7/1999 | Gutierrez et al. | 361/695 |
| 5,926,386 A | * | 7/1999 | Ott et al. | 364/175 |
| 5,929,581 A | * | 7/1999 | Brocklin et al. | 318/471 |
| 5,963,887 A | * | 10/1999 | Giorgio | 702/64 |
| 5,974,557 A | * | 10/1999 | Thomas et al. | 702/322 |
| 6,006,168 A | * | 12/1999 | Schumann et al. | 702/132 |
| 6,014,611 A | * | 1/2000 | Arai et al. | 702/132 |
| 6,023,402 A | * | 2/2000 | Kaminski | 361/103 |
| 6,058,012 A | * | 5/2000 | Cooper et al. | 361/704 |
| 6,101,459 A | * | 8/2000 | Tavallaei et al. | 702/132 |
| 6,134,667 A | * | 10/2000 | Suzuki et al. | 713/300 |
| 6,158,012 A | * | 12/2000 | Watts, Jr. | 713/322 |

* cited by examiner

Primary Examiner—Sumati Lefkowitz
(74) Attorney, Agent, or Firm—Fletcher, Yoder & Van Someren

(57) ABSTRACT

A method and system for controlling the power supply fan in a computer system. The speed of a power supply fan can be made directly proportional to the temperature of the power supply. The fan speed can also be controlled by a processor with software commands according to the temperature of the processor. The speed of the fan will be dictated by the higher of the two commands driving it. Therefore, the power supply fan can never be commanded by the processor to run at a lower speed than that required by its own thermal environment. A Fan Speed Control Circuit enables the computer system to command the power supply fan to run at a higher speed. The processor temperature can be monitored with a temperature transducer and analog signal conditioning circuitry.

11 Claims, 2 Drawing Sheets

DUAL POWER SUPPLY FAN CONTROL—THERMISTOR INPUT OR SOFTWARE COMMAND FROM THE PROCESSOR

BACKGROUND AND SUMMARY OF THE INVENTION

The application relates to smart cooling systems in computer power supplies.

Background: Thermal Requirements

With the increase in packaging density of devices in computer products, the control of the thermal environment inside the chassis has become a critical part of the design process in order to maintain system stability and reliability. Heat-generating components, modules, and boards are packaged ever more densely to reduce the chassis volume, resulting in a more concentrated thermal load. This "technological advancement" causes additional headaches for designers adding components into the computer chassis.

An inferior cooling design can cause power supply circuit components to operate at abnormal temperatures. Without proper air circulation, heat builds up inside the computer chassis. Circuit components operating in temperatures not within design specifications may cause RF interference, rebooting, hard drive errors, and other undesirable consequences affecting the integrity of the system. Additionally, over time, sensitive components such as the CPU or hard drive may undergo physical damage from excessive expansion and contraction due to thermal dynamics of the system.

Since a power supply is a large concentrated source of heat, a cooling fan is normally designed into the power supply chassis, to exhaust the warm air from the computer chassis itself and to draw the air across power supply components as the air exits the system. Cooling fans are low-cost mechanical devices that tend to fail at higher rates than most other system components. Since a cooling fan failure is often masked by background noise (hard drive noise), the problem becomes apparent only when irregularities begin to occur in operation or when a total system failure occurs.

Background: Fan Redundancy

As a result, computer power supply companies are seeking a variety of more cost effective methods for enhancing power supply performance and reliability. For example, vendors may design redundant supplies into a single power supply module to enhance the reliability and integrity of the mother system. This particular design enhancement adds to the thermal load and overall cost of the system. In conjunction with this design, several fans may be added to control the excess heat. Another approach provided in the industry is to connect an audible over-temperature alarm to a spare power supply plug e.g., the 110 Alert™ by PC Power & Cooling, Inc. However, this alternative offers only "coarse" control over the thermal problems associated with enclosed electronics. Temperature fluctuations may still be excessive causing physical damage to component structures from thermal expansion/contraction.

Background: Power Efficiency

With a steady increase in energy consumption occurring in the United States, the Environmental Protection Agency ("EPA") has developed a program to help curb this usage. The EPA's Energy Star Program is a voluntary partnership with the computer industry to promote the introduction of energy-efficient personal computers, monitors, and printers in an effort to reduce air pollution caused by power generation. Note that Energy Star does not apply directly to power supplies, but to the computer systems in which the supplies reside. However, many companies strive to meet the spirit of the program, and consumers are demanding it by what they purchase. Many vendors simply design the power supply fan to rotate at a fixed speed, but in this case the fan's constant operation wastes energy. Other vendors may design the fan to run proportionately to the temperature in a linear relationship.

Background: Current Heat Dissipation Solutions

Due to cost reasons, manufacturers will typically include only a single fan in their computer systems. For both cost and power efficiency reasons the single fan will have relatively low input power consumption. However, the processors included in such systems generally dissipate considerable heat. With the input power to the fan being lower, the power supply fan speed will also be low. This low fan speed may not provide enough airflow for the processor. Often, the power supply fan ramp will need to be increased in order to cool the processor and prevent overheating.

In U.S. Pat. No. 5,687,079 there is disclosed a method of temperature dependent fan speed control. The method disclosed in the issued patent suffers from particular shortcomings. The speed of the fan is dependent upon the ambient temperature inside the computer and the type of CPU which is installed in the computer. If the CPU is of a type that would normally demand extra cooling (and therefore a higher fan speed), the fan is operated on a higher voltage curve. The speed of the fan is dependent only on ambient temperature and CPU type, not actual CPU temperature.

The disadvantage of an increased fan ramp is that the acoustic noise level also increases. Currently there is no communication between the processor and the power supply fan in order to direct an increase in fan ramp to a speed satisfactory to cool the processor but not more than is necessary so as to control the acoustic noise level. Further, once sufficient cooling has taken place, current designs do not decrease fan speed in order to dampen acoustic noise levels and conserve power. The increased fan ramp is in effect all the time.

DUAL POWER SUPPLY FAN CONTROL

The present application discloses a method and system for controlling the power supply fan in a computer system. The speed of a power supply fan can be made directly proportional to the temperature of the power supply. Additionally, the fan speed can be controlled by a processor with software commands according to the temperature of the processor. The speed of the fan will be dictated by the higher of the two commands driving it. Therefore, the power supply fan can never be commanded by the processor to run at a lower speed than that required by its own thermal environment. The system can only increase the power supply fan speed. A Fan Speed control Circuit enables the computer system to command the power supply fan to run at a higher speed. The processor temperature can be monitored with a temperature transducer and analog signal conditioning circuitry. If software control is desired, an analog to digital converter can be used for software manipulation. A digital to analog converter can then be used to provide the proper input for the power supply fan circuit.

An advantage of the presently preferred embodiment is that the computer system can increase the power supply fan speed to ensure that the processor does not over heat.

Another advantage of the presently preferred embodiment is that the system fan command can be software controlled. This will allow the system to program the desired fan ramp for optimal thermal and acoustic performance.

Another advantage of the presently preferred embodiment is that the minimum fan speed is adjustable and does not require a hardware clamp.

Another advantage of the preferred embodiment is that the circuit was designed with very common, readily available, low cost components. This circuit was designed with ordinary transistors, diodes and resistors, small low voltage capacitors, and only one integrated circuit.

Another advantage is that the fan speed is regulated to more closely control the temperature profile. The control circuit can precisely regulate fan speeds, as determined by the ambient temperature to guarantee the required thermal environment. Since the fan may be controlled at a minimum necessary speed, the power dissipated by the fan is reduced. Additionally, a reduction in acoustic noise, vibration, and wear inside the fan is realized.

Another advantage is that the fan in the power supply can be turned off, saving energy. This allows the computer system to be certified as ENERGY STAR™ compliant.

Another advantage is that this circuit protects the computer from catastrophic failure in the event that the fan is erroneously turned off. Thus the flexibility of software-controlled operation can be obtained while still realizing very robust fail-safe operation.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Operational Overview

Figures 1, 4:
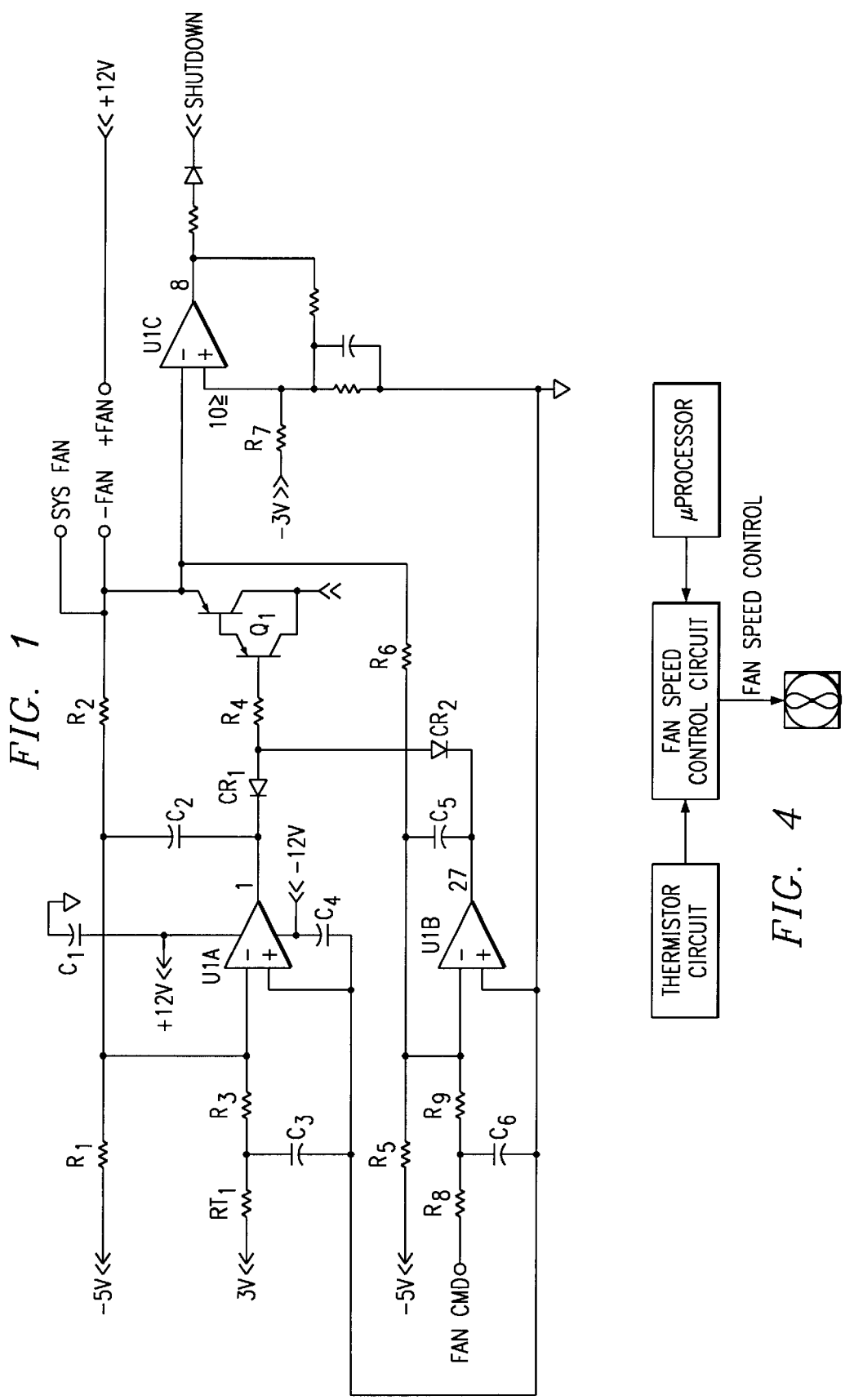
FIG. 1 shows a circuit diagram of the presently preferred embodiment.
FIG. 4 shows a block diagram of the inputs to and output from the Fan Speed Control Circuit.

FIG. 4 shows a block diagram of the inputs to and output from the Fan Speed Control Circuit. The Fan Speed Control Circuit receives two inputs: one from a Thermistor Circuit and another, software controlled input, from the Microprocessor. During normal operation, when the user first powers-up the system, the fan turns on. The Thermistor circuit provides control of the fan speed relative to the temperature of the power supply. The Microprocessor provides software control of the fan speed relative to its temperature. The Fan Speed Control Circuit selects the higher of the two inputs to control the speed of the fan. The circuit operates to regulate the fan speed as necessary to maintain a controlled thermal environment for the system. The system can only increase the power supply fan speed, it can never be commanded by the processor to run at a lower speed than that required by its thermal environment. However, if both the system and the thermistor circuit lower their fan speed requirements, the fan speed will lower. Even in this even, the fan will run at the higher speed according to the Fan Speed control circuit inputs.

Preferred Circuit Embodiment

The innovative circuit regulates the fan speed in dependence upon temperature and allows the computer system to increase fan speed when necessary. FIG. 1 shows a circuit diagram of the presently preferred embodiment. The circuit is comprised of an amplifier for an analog system command, an amplifier for a thermistor which monitors the power supply temperature, a power fan driver stage, and an over-temperature comparator monitor. The analog system fan command signal (FAN CM1) is applied to amplifier U1B. U1B is configured as an inverting amplifier. Resistor R8, e.g., a 4.99K ohm resistor, resistor R9, e.g., a 4.99K ohm resistor, and capacitor C6, e.g., a 0.01 microfarad capacitor, provide noise filtering. The FAN CMD signal range is 0–2.5V. The gain of amplifier U1B is defined as: $-R6/(R8+R9)$, where, in the presently preferred embodiment, R6 is a 31.6K ohm resistor. A DC offset of $(-R6/R5)*(-5V)$, where, in the presently preferred embodiment, R5 is a 22.6K ohm resistor, is needed to level shift the output. As FAN CMD becomes more positive, the output of U1B 7 goes negative. Ignoring the thermistor amplifier stage (U1A), a FAN CMD of 2.5V will turn power amplifier Q1 on maximum fan speed. Likewise, a FAN CMD of 0V will drive amplifier Q1 for a minimum fan speed. Thermistor RT1, e.g., a 10K ohm thermistor, and the inverting amplifier U1A monitor the power supply temperature. Thermistor RT1, R3, e.g., a 3.01K ohm resistor, and C3, e.g., a 0.01 microfarad capacitor, provide noise filtering. Thermistor RTI has a negative temperature coefficient. Thus, as the power supply temperature increases, thermistor RT1 decreases. The gain of amplifier U1A is defined as: $-3.3V*R2/(RT1+R3)$, where, in the presently preferred embodiment, R2 is a 20 K ohm resistor. Thermistor RT1 is a nonlinear device. R3 helps in making the output more linear. A DC offset of $(-R2/R1)*(-5V)$, where, in the presently preferred embodiment, R1 is a 7.32K ohm resistor, is needed to level shift the output. As temperature increases, thermistor RT1 decreases and the output of amplifier U1A 1 goes negative. Ignoring the U1B amplifier stage, an increasing temperature causes amplifier Q1 to turn on harder which then increases the fan speed.

The higher fan speed command (of U1A or U1B) is selected and passed to the power driver amplifier Q1. Selection is accomplished by connecting the outputs of the amplifiers U1A and U1B to diodes CR1 and CR2, respectively. Since the amplifiers are in the inverting configuration and increased fan speed is represented by a output tending negative, the amplifier with the most negative output will forward bias the diode connected to it and drive amplifier Q1. For example, if the output at 1 is more negative than the output at 7, then CR1 is forward biased and CR2 is off. In this case, the power supply thermistor controls the fan speed. If the system desires more airflow, FAN CMD can be made more positive. This positive increase will the output at 7 to become more negative. Control will be switched to the system when the output at 7 is more negative than the output at 1 and CR2 is forward biased (CR1 is off).

The minimum fan speed is determined by the scaling of the U1B amplifier stage and not by a specific hardware clamp. The minimum fan speed is determined by the OV FAN CMD input. This is done by scaling the amplifier gain and offset so that the fan speed commanded by a 0V FAN CMD is always greater than that commanded by the thermistor. Also, since power amplifier Q1 is inside feedback of both amplifier stages, the fan ripple voltage is eliminated. Elimination of fan ripple voltage will result in reduction of acoustic noise level.

The comparator U1C monitors the output (−FAN) so that the power supply can be shutdown in an overtemperature condition. Unless the fan voltage at shutdown is greater than the maximum fan voltage that can be commanded from the system the power supply could be shutdown by the system. As temperature increases −FAN becomes more negative. When this voltage is less than the voltage at 10, the output of the comparator 8 goes high. This signal can then be connected to the power supply shutdown circuitry.

Sample Power System Application

Figure 2:
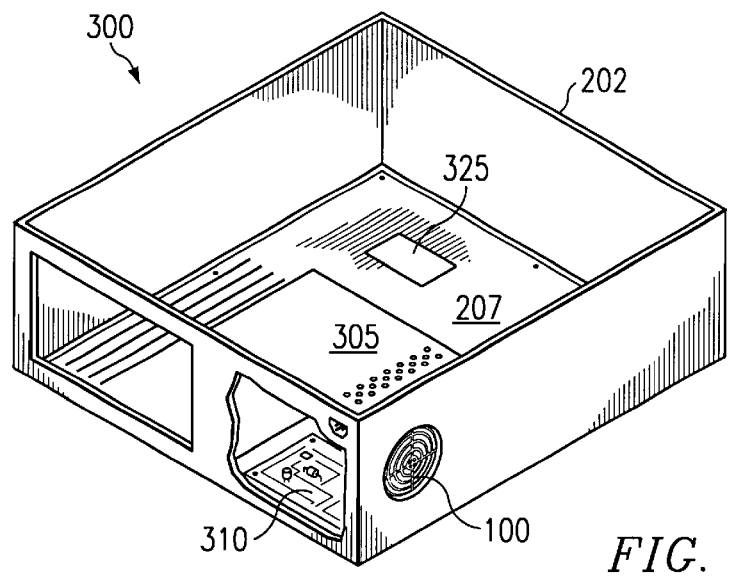
FIG. 2 shows a physical diagram of a computer system with a power supply incorporating the innovative control circuitry.

FIG. 2 shows a physical diagram of a computer system with a power supply incorporating the innovative control circuitry. Computer system 300 is enclosed with a chassis 202 and, in this example, comprises a power supply module 305 which includes the innovative cooling fan speed control circuitry 310. The circuitry 310 connects to the cooling fan 100 controlling fan speed in relation to the temperature inside the chassis 202. The computer system board 207 comprises, among other chips, a microprocessor 325 which interfaces to the control circuitry 310. Software control of the cooling fan 100 via the computer operating system is possible since the control circuitry 310 interfaces with the microprocessor 325.

Figure 3:
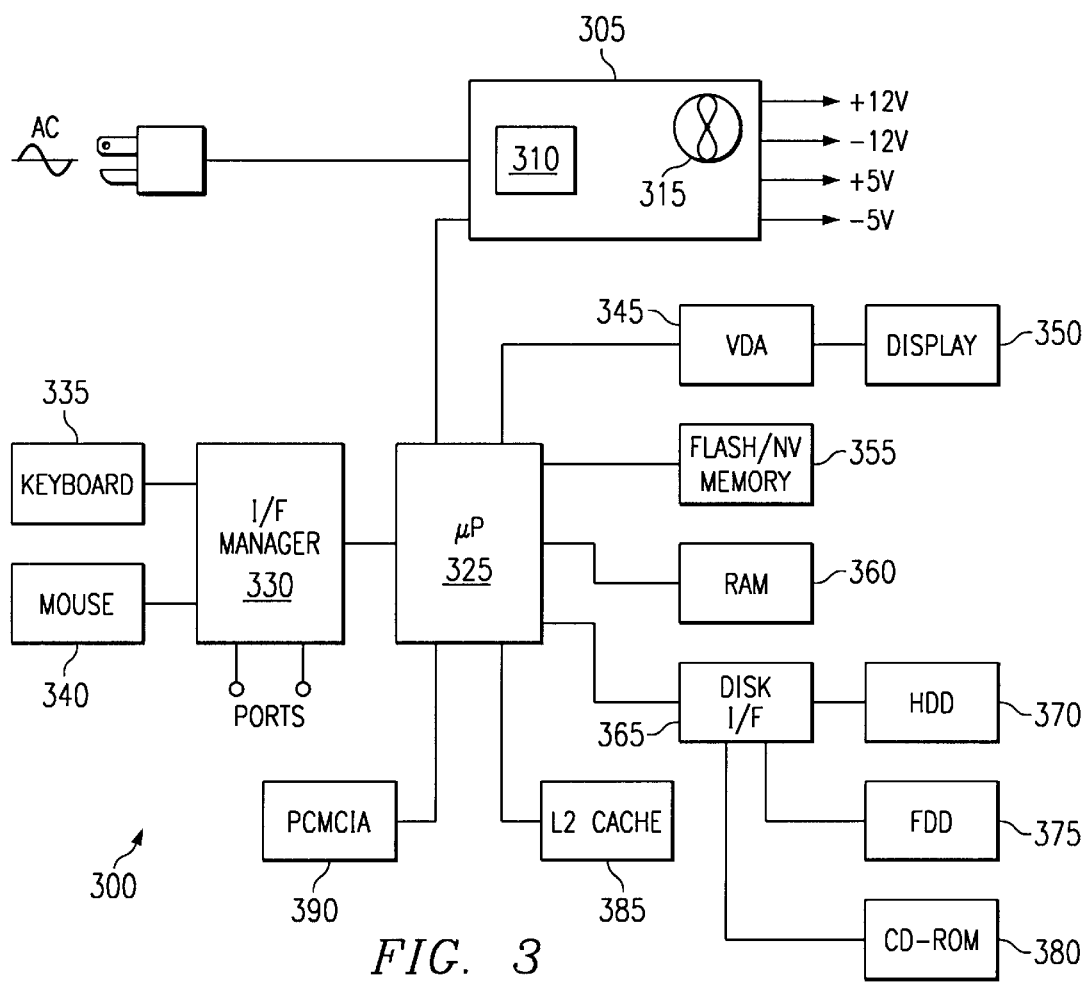
FIG. 3 shows a block diagram of a computer system according to the presently preferred embodiment.

FIG. 3 shows a block diagram of a computer system 300 according to the presently preferred embodiment. In this example, the computer system, includes:

user input devices (e.g. keyboard 335 and mouse 340);

at least one microprocessor 325 which is operatively connected to receive inputs from said input device, through an interface manager chip 330 (which also provides an interface to the various ports);

a power supply 305 which is connected to draw power from AC mains and provide DC voltage to the computer system 300 components; the innovative power supply control circuit 310, located within the power supply 305, connects to fan 100 and also interfaces to the microprocessor 325;

a memory (e.g. flash or non-volatile memory 355 and RAM 360), which is accessible by the microprocessor;

a data output device (e.g. display 350 and video display adapter card 345) which is connected to output data generated by microprocessor; and a magnetic disk drive 370 which is read-write accessible, through an interface unit 365, by the microprocessor.

Optionally, of course, many other components can be included, and this configuration is not definitive by any means. For example, the computer may also include a CD-ROM drive 380 and floppy disk drive ("FDD") 375 which may interface to the disk interface controller 365. Additionally, L2 cache 385 may be added to speed data access from the disk drives to the microprocessor, and a PCMCIA 390 slot accommodates peripheral enhancements.

Alternative Embodiment: Systems With Dedicated Processor Fans

According to disclosed class of alternative embodiments the innovative control method may be used in systems containing both power supply fans and fans dedicated to the processor. If the power supply fan can help in cooling the processor, the system can send a command to the power supply for increased fan speed.

Alternative Embodiment: Other Computer and Electronic Systems

According to another disclosed class of alternative embodiments the innovative control method may be applicable to other electronic systems which use "smart" power-managing systems and use fans for cooling environments and components.

According to a disclosed class of innovative embodiments, there is provided: a computer power supply system, comprising: a fan; and a control circuit connected to receive more than one control input and to control said fan accordingly; wherein said control inputs can cause said control circuit to increase fan speed under at least some circumstances; and wherein said control circuit automatically selects the control input which indicates the highest fan speed to drive said fan.

According to another disclosed class of innovative embodiments, there is provided: a method for controlling a cooling fan in a complex electronic system, comprising the steps of: (a.) turning on said fan when powering up said system; (b.) receiving more than one command input; and (c.) selecting the command input which indicates the highest fan speed to drive the speed of said fan.

According to another disclosed class of innovative embodiments, there is provided: a computer system, comprising: a user input device, a microprocessor which is operatively connected to detect inputs from said input device, random-access memory which is connected to be read/write accessible by said microprocessor, and an output device operatively connected to receive outputs from said microprocessor; and a power supply connected to provide power to said microprocessor and said memory, and comprising a fan; and a control circuit connected to receive more than one command input and control said fan accordingly; wherein the speed of said fan is varied under at least some circumstances according to thermal environment; wherein said control circuit automatically selects the command input which indicates the highest fan speed to drive said fan.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

It should also be noted that the disclosed innovative ideas are not by any means limited to systems where the managing microcontroller is not the CPU.

It should also be noted that the disclosed innovative ideas are not by any means limited to power supply cooling systems, but can also be implemented for CPU cooling fans.

It should also be noted that the disclosed innovative ideas are not by any means limited to systems with a single fan, but can also be implemented in systems with multiple fans.

It should also be noted that the disclosed innovative ideas may also be applicable to systems where the fan speed is dependent on temperature and is not necessarily linear, but variable in nature.

It should also be noted that the disclosed innovative ideas may also be applicable for other temperature sensor placements.

It should also be noted that the disclosed innovative ideas may be designed into an ASIC with other system functions.

Of course, in implementing power supply circuits and systems, safety is a very high priority. Those of ordinary skill in the art will therefore recognize the necessity to review safety issues carefully, and to make any changes in components or in circuit configuration which may be necessary to improve safety or to meet safety standards in various countries.

It should also be noted that the disclosed innovative ideas are not limited only to Windows, DOS or UNIX systems, but can also be implemented in other operating systems.

It should also be noted that the disclosed innovative ideas are not limited only to systems using ISA, EISA, and/or PCI busses, but can also be implemented in systems using other bus architectures.

It should also be noted that the disclosed innovative ideas are not limited only to systems based on an x86-compatible microprocessor, but can also be implemented in systems using 680x0, RISC, or other processor architectures.

It should also be noted that the disclosed innovative ideas are not by any means limited to systems using a single-processor CPU, but can also be implemented in computers using multiprocessor architectures.

It should also be noted that the disclosed innovative ideas may be implemented with notebook computers.

It should also be noted that the disclosed innovative circuit may further comprise circuitry to send a command to a processor to shutdown the system.

Additional general background, which helps to show the knowledge of those skilled in the art regarding the system context, and of variations and options for implementations, may be found in the following publications, all of which are hereby incorporated by reference. In particular, many details may be found in the books from MindShare, Inc., including PROTECTED MODE SOFTWARE ARCHITECTURE, CARDBUS SYSTEM ARCHITECTURE, EISA SYSTEM ARCHITECTURE, ISA SYSTEM ARCHITECTURE, 80486 SYSTEM ARCHITECTURE, PENTIUM PROCESSOR SYSTEM ARCHITECTURE, PCMCIA SYSTEM ARCHITECTURE, PLUG AND PLAY SYSTEM ARCHITECTURE, PCI SYSTEM ARCHITECTURE, USB SYSTEM ARCHITECTURE, and PENTIUM PRO PROCESSOR SYSTEM ARCHITECTURE, all of which are hereby incorporated by reference, and in the PENTIUM PROCESSOR FAMILY DEVELOPER'S MANUAL 1997, the MULTIPROCESSOR SPECIFICATION (1997), the INTEL ARCHITECTURE OPTIMIZATIONS MANUAL, the INTEL ARCHITECTURE SOFTWARE DEVELOPER'S MANUAL, the PERIPHERAL COMPONENTS 1996 databook, the PENTIUM PRO PROCESSOR BIOS WRITER'S GUIDE (version 2.0, 1996), and the PENTIUM PRO FAMILY DEVELOPER'S MANUALS from Intel, all of which are hereby incorporated by reference.

What is claimed is:

1. A computer system, comprising:
   a processor;
   a power supply;
   a fan; and
   a control circuit to control fan operation, the control circuit being coupled to a plurality of control inputs that direct the control circuit to operate the fan at a desired fan speed, a first control input corresponding to power supply temperature and a second control input being provided by the processor and corresponding to processor temperature, wherein the control circuit controls fan operation according to the control input that directs the control circuit to operate the fan at the highest fan speed.

2. The system as recited in claim 1, wherein the control circuit increases fan speed with an increase in temperature and decreases fan speed with a decrease in temperature.

3. The system as recited in claim 1, wherein the second control input comprises programming commands.

4. The system as recited in claim 1, wherein the first control input is provided by a thermistor.

5. The system as recited in claim 1, wherein the control circuit is disposed within the power supply.

6. The system as recited in claim 1, wherein the control circuit is operable to stop operation of a power supply if the fan fails.

7. A method for controlling a fan in an electronic system, comprising the acts of:
   (a) turning on the fan when starting the electronic system;
   (b) providing a first control signal to drive fan speed relative to power supply temperature;
   (c) providing a software control signal from a processor to drive fan speed relative to the temperature of the processor;
   (d) selecting the control signal which indicates the highest fan speed to drive the speed of the fan; and
   (e) controlling the fan speed according to the control input selected.

8. The method as recited in claim 7, wherein during act (a) the fan is operated to increase fan speed with an increase in temperature and decrease fan speed with a decrease in temperature.

9. The method as recited in claim 7, wherein act (d) is performed by a control circuit.

10. The method as recited in claim 7, wherein the software control signal is provided by the processor.

11. The method as recited in claim 7, wherein the first control input is provided by a thermistor monitoring the temperature of the power supply.

* * * * *